(12) United States Patent
Kuzma

(10) Patent No.: US 7,122,391 B2
(45) Date of Patent: Oct. 17, 2006

(54) WAFER-LEVEL TEST STRUCTURE FOR EDGE-EMITTING SEMICONDUCTOR LASERS

(75) Inventor: Andrew J. Kuzma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/659,898

(22) Filed: Sep. 11, 2003

(65) Prior Publication Data

US 2004/0046221 A1    Mar. 11, 2004

Related U.S. Application Data

(62) Division of application No. 10/126,348, filed on Apr. 18, 2002.

(51) Int. Cl.
*H01S 5/026* (2006.01)
*H01L 33/00* (2006.01)

(52) U.S. Cl. ............... 438/29; 257/E33.067

(58) Field of Classification Search ........... 438/16, 438/29, 69, 24, 32; 372/49, 99; 257/E33.067, 257/E33.068, E33.071, E33.072
See application file for complete search history.

(56) References Cited

U.S. PATENT DOCUMENTS

| | | | |
|---|---|---|---|
| 4,653,058 A * | 3/1987 | Akiba et al. ........... 372/50 |
| 4,881,237 A | 11/1989 | Donnelly | |
| 4,971,927 A * | 11/1990 | Leas ................ 438/26 |
| 5,694,048 A | 12/1997 | Boudreau et al. | |
| 5,912,872 A * | 6/1999 | Feldman et al. ...... 369/13.32 |
| 5,987,202 A | 11/1999 | Gruenwald et al. | |
| 6,205,274 B1 | 3/2001 | Zhou | |
| 6,449,296 B1 * | 9/2002 | Hamasaki et al. ....... 372/36 |
| 6,452,623 B1 | 9/2002 | Sousa | |
| 6,459,716 B1 * | 10/2002 | Lo et al. ............ 372/50 |
| 6,487,224 B1 * | 11/2002 | Ohashi et al. ......... 372/43 |
| 6,631,005 B1 * | 10/2003 | Komazaki et al. ...... 356/499 |
| 6,668,000 B1 * | 12/2003 | Choa ................ 372/43 |
| 2002/0064191 A1 | 5/2002 | Capewell et al. | |

* cited by examiner

*Primary Examiner*—Carl Whitehead, Jr.
*Assistant Examiner*—Jennifer Dolan
(74) *Attorney, Agent, or Firm*—Blakely, Sokoloff, Taylor & Zafman LLP

(57) ABSTRACT

Wafer-level stage testing of semiconductor lasers can be facilitated by directing a light beam emitted from the semiconductor laser toward a direction different from a path of the light beam as originally emitted from the laser. A test structure can be coupled to a back facet of the laser and can include a first region separated from a second region by an inclined interface. When a light beam is emitted from the laser, the light beam can be received on the inclined interface and then directed toward a light detector for detection and evaluation.

10 Claims, 6 Drawing Sheets

WAFER-LEVEL TEST STRUCTURE FOR EDGE-EMITTING SEMICONDUCTOR LASERS

CROSS-REFERENCE TO RELATED APPLICATIONS

This application is a divisional of U.S. patent application Ser. No. 10/126,348, filed on Apr. 18, 2002, and claims priority therefrom under 35 U.S.C.§ 120. The priority application is currently pending.

TECHNICAL FIELD

This disclosure relates generally to semiconductor lasers, and in particular but not exclusively, relates to a method of facilitating the wafer-level fabrication stage testing of semiconductor lasers without having to cut the individual laser die from the wafer.

BACKGROUND

Semiconductor lasers are commonly used as light sources in applications involving optical communications. Such lasers can generate light in response to an application of an electrical signal. A common laser structure is called an "edge-emitting laser" that usually includes a flat junction formed between two pieces of semiconductor material, each having been treated with a different type of impurity. When an electrical current is passed through the laser, light emerges from a plane of the junction region, at an edge of the laser. Examples of such a laser include the Distributed Feedback (DFB) laser, the Fabry-Perot laser, and the Distributed Bragg Reflector Laser (DBR).

A completed semiconductor laser is generally made in four phases, similar to other semiconductor devices. A first phase involves an extraction and purification of raw semiconductor materials, such as sand for silicon. Next, a method called "crystal growth and wafer preparation" is used to form wafers, which are thin disks of semiconductor material. In a third stage, "chip fabrication" , a plurality of lasers are created in and on the wafer surface. After chip fabrication, the lasers on the wafer must be tested. The electrical test (also called a "wafer sort") may be part of the last step of chip fabrication or an initial step in the packaging process, which involves separating the wafer into individual lasers (or "chips") and placing them into protective packages A large problem with semiconductor lasers is a high cost of manufacturing associated with them. In order to confirm that a laser is properly functioning, an individual laser must first be cut from the wafer, separated, and at least partially packaged before it can be tested. If a laser is found to be defective, it is discarded. The yield of a wafer may be a key indicator of costs, and often times the yield may be low. Costs become much more problematic especially since the overall costs may include packaging costs for what tests ultimately determine to be a defective chip.

One response to this problem, has been the creation of the Vertical Cavity Surface-Emitting Laser (VCSEL), which in contrast to the edge-emitting laser, can emit light from the wafer perpendicular to the plane of the junction region. A light output perpendicular to the surface of the wafer allows VCSELs to be tested at the wafer-level stage by the monitoring of emitted light. In contrast, it is difficult to test an edge-emitting laser at the wafer-level stage, because the laser light is not accessible until the lasers have been cut from the wafer, since the individual placement of the individual lasers on the wafer does not provide sufficient room to insert light monitoring devices between each laser.

In summary, the horizontal emission of light by edge-emitting lasers make it difficult to perform testing at the wafer-level stage. As a result, edge-emitting lasers must be partially packaged before test, resulting in additional costs for the manufacturer that are eventually passed on to consumers. Competing lasers, such as the VCSEL, have a testing advantage over the edge-emitting laser, but cannot replace the edge-emitting laser in many applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
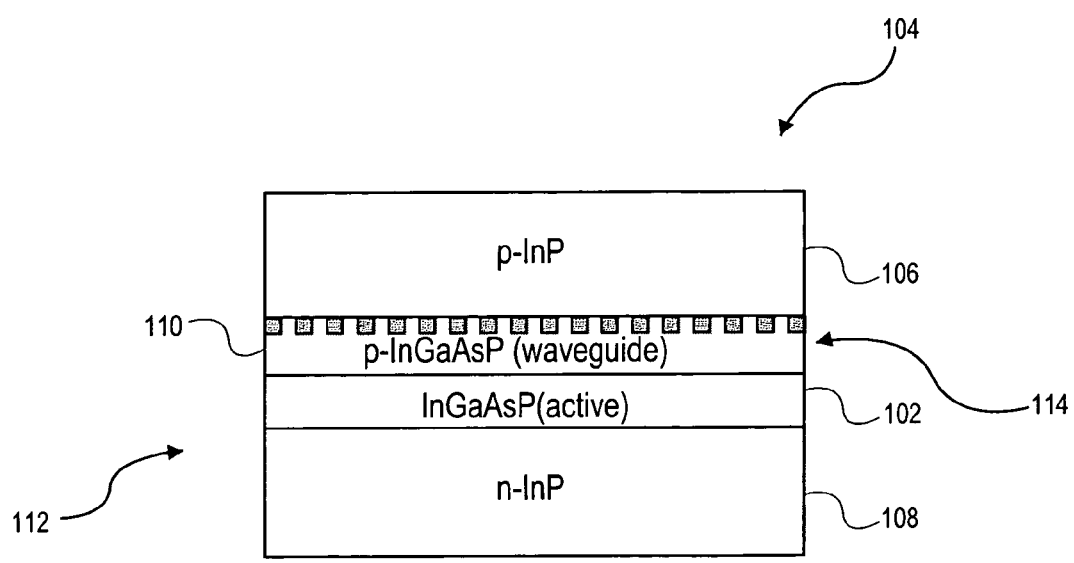
FIG. 1 is a cross-sectional view of an example individual edge-emitting laser.

Embodiments of a system and method for incorporating a test structure into an edge-emitting laser on a wafer are described herein. For simplicity and clarity of explanation, various embodiments of the invention are shown in the figures according to various views. It is to be appreciated that such views are merely illustrative and are not necessarily drawn to scale or to the exact shape. Furthermore, it is to be appreciated that the actual devices utilizing principles of the invention may vary in shape, size, configuration, contour, and the like, other than what is shown in the figures, due to different manufacturing processes, equipment, design tolerances, or other practical considerations that result in variations from one semiconductor device to another.

As an overview, an embodiment of the invention provides a test structure coupled to a back facet of a laser. In other embodiments, the test structure may also be coupled to a front facet of the laser. The test structure includes a first region and a second region made of different materials and an inclined interface located between the two regions. When a light beam is emitted from an edge of the laser (such as from the back facet), the light beam can be received on the inclined interface and then reflected toward a direction different from (such as orthogonal to) a path of the light beam as originally emitted from the laser. At a next step, a presence or a non-presence of the reflected light beam, as well as characteristics of the light beam, can be detected using a light detector. If a light beam is detected, the light beam can be converted into an electrical current, and then monitored to determine whether the laser is functioning according to design specifications. For example, a frequency and intensity of the light beam may be monitored.

It should be noted that, although an edge-emitting laser is primarily discussed in the illustrations herein, the invention can be used with other types of lasers or light emitting devices that may emit light horizontally or in a direction normally inaccessible to light detectors. Furthermore, it is appreciated that "light" as discussed in the following descriptions may include not only visible light but also light of other frequency ranges, such as infrared light, ultraviolet light, and the like.

In the following description, numerous specific details are provided, such as components of an edge emitting laser in FIG. 1, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Generally, when applied with a current, a laser may emit a primary light output from a front facet while a back facet emits a lesser amount of light. Light emitted from the back facet, nevertheless, can provide an indication of the condition and characteristics of the laser. For example, typically, the frequency of light emitted from the back facet correlates to the frequency of light emitted from the front facet. Furthermore, although an intensity of emitted light between the two facets may vary, the intensity of the light emitted from one facet may usually be determined from the intensity of light detected at the other facet by methods known in the art. Generally, light from both the front and back facets may be emitted from the edge emitting laser in a horizontal direction and the presence and characteristics of the light may indicate whether the laser may be functioning properly.

FIG. 1 illustrates a cross-sectional view of a typical edge-emitting device, die, or laser 104. In this example, a Distributed Feedback (DFB) laser 104 is shown. In an embodiment, laser 104, may include semiconductor material, including an active region 102 sandwiched between an upper layer 106 and a lower layer 108. As shown in the figure, upper layer 106 may be made of a p-type Indium-Phosphate material, while the lower layer may be comprised of an n-type Indium-Phosphate material, for example. A suitable material for active region 102 may include a p-type Indium-Gallium-Arsenic-Phosphorus (InGaAsP) material in an embodiment. Above active region 102 may include a waveguide element 110, also comprised of, for example, a p-type InGaAsP material.

For illustrative purposes, one end of laser 104 is designated as a front facet 112 and the other end is designated as a back facet 114. Within laser 104, the ends of a lasing cavity have been cleaved and may be coated with reflective coatings (not shown). One end being primarily reflective and becoming the back facet 114; the other end, bring primarily transparent, thus allowing the light beam to escape, becoming front facet 112. Note that although laser 104 shown in the examples herein is a DFB laser, an embodiment of the invention can be used with any semiconductor laser (e.g., Fabry-Perot, and the like) that may utilize directional control of an emitted light beam to facilitate wafer-level stage testing.

Figure 3:
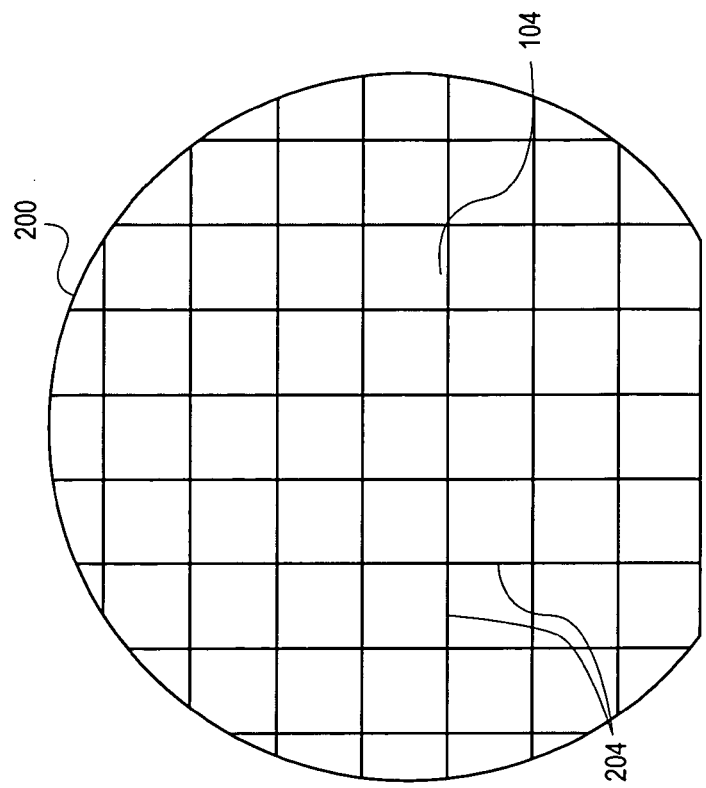
FIG. 3 is a top-down view of the plurality of edge-emitting lasers of FIG. 2 on the wafer.
Figure 2:
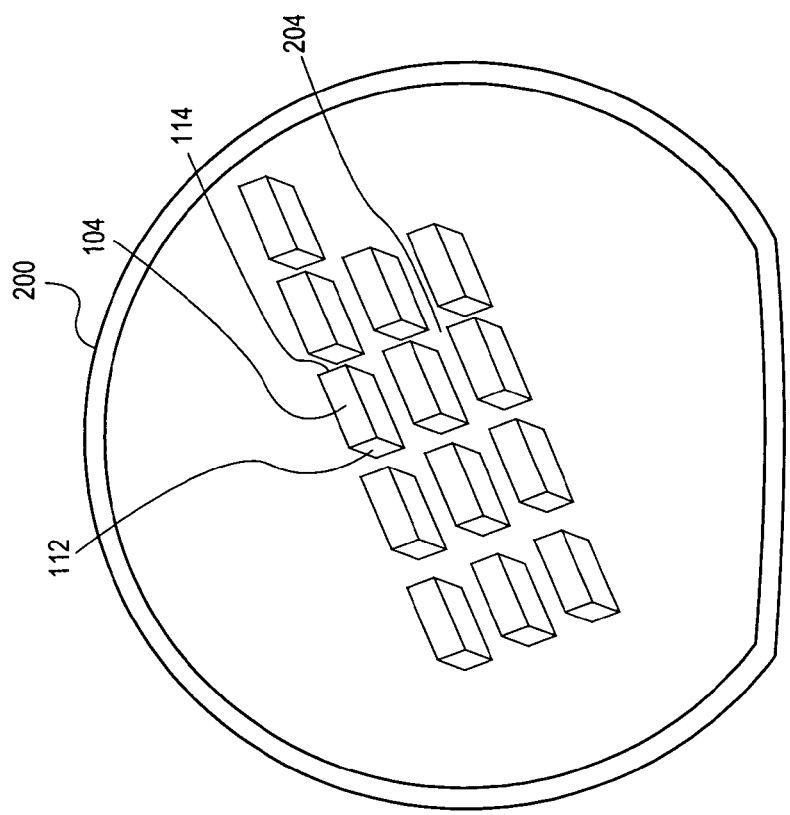
FIG. 2 is a perspective view of a plurality of edge-emitting lasers on a wafer.

FIGS. 2 and 3 illustrate some of the difficulties associated with testing of edge-emitting lasers at a wafer-level stage, which an embodiment of the invention addresses. Shown in FIG. 2 is a three-dimensional, magnified view of a wafer 200 after individual lasers (such as laser 104) have been fabricated in and on wafer 200. Scribe lines 204 form narrow channels between individual lasers 104. Close proximity of individual lasers 104 to one another, combined with a substantially horizontal emission of light from front facet 112 and back facet 114, usually do not allow access to emitted light for suitable testing purposes. For example, if an electrical current is applied to laser 104, light may be emitted from both front facet 112 and back facet 114, but may be blocked from a light detector by adjacent lasers on either side of laser 104. FIG. 3 illustrates a top-down view of wafer 200. The scribe lines 204 that separate individual lasers 104 form a grid pattern, illustrating the proximity of the lasers 104 to one another.

Figure 4:
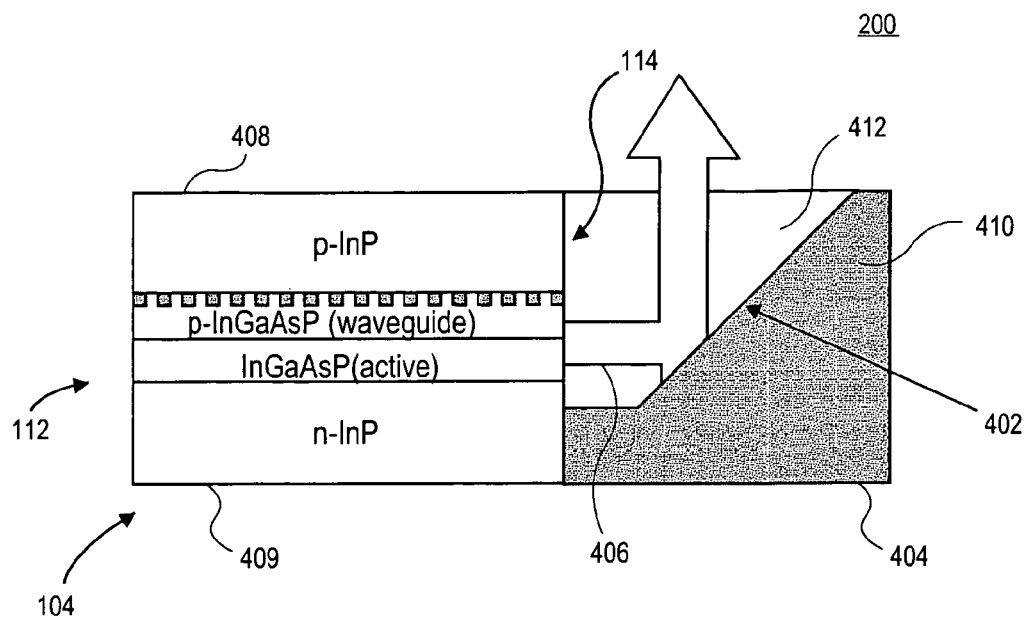
FIGS. 4–5 are cross-sectional views of the edge-emitting laser coupled to a test structure according to embodiments of the invention.

FIG. 4 illustrates an example embodiment in accordance with the teachings of the present invention. A test structure 404 may be optically coupled to back facet 114 of laser 104 included in wafer 200. In an embodiment, test structure 404 may be comprised of a first region 410 and a second region 412. An inclined interface 402, which may serve as a reflective surface in one embodiment, can be defined at the interface between first region 410 and second region 412. In one embodiment, when an electrical current is applied to wafer 200, a light beam 406 may be emitted from back facet 114 of laser 104 in a direction substantially parallel to top and bottom side surfaces 408 and 409 of wafer 200. Emitted light beam 406 may then be directed to inclined interface 402 and redirected through second region 412 toward top or bottom side surface 408 or 409 of wafer 200 in a direction different from (such as orthogonal to) the light beam's original path as emitted from laser 104.

Figure 7:
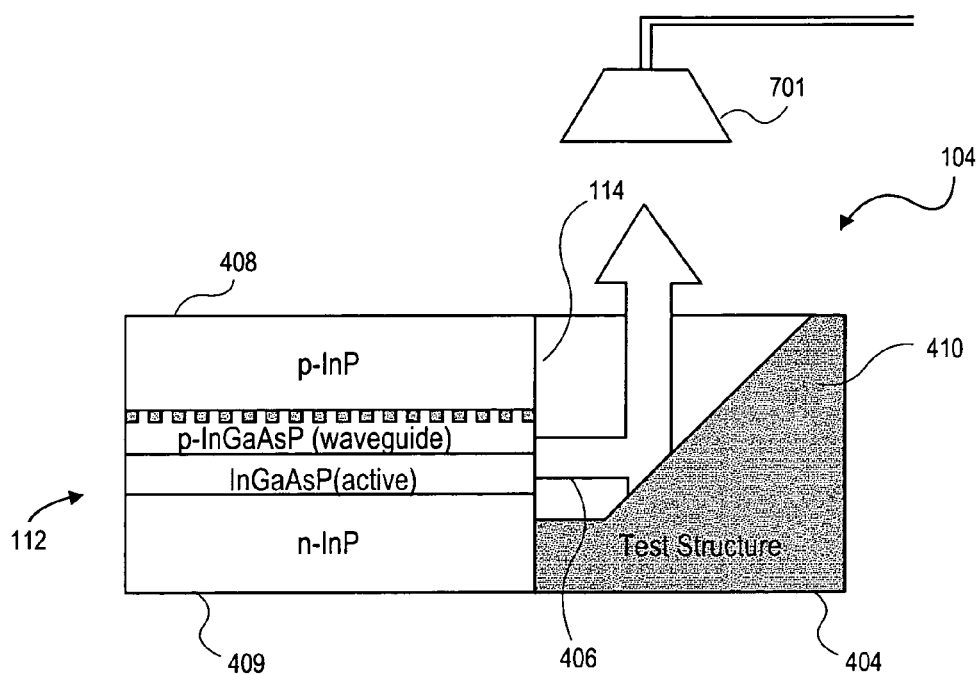
FIGS. 7–9 are cross-sectional views of an edge-emitting laser coupled to a test structure and a light detector according to embodiments of the invention.
Figure 8:
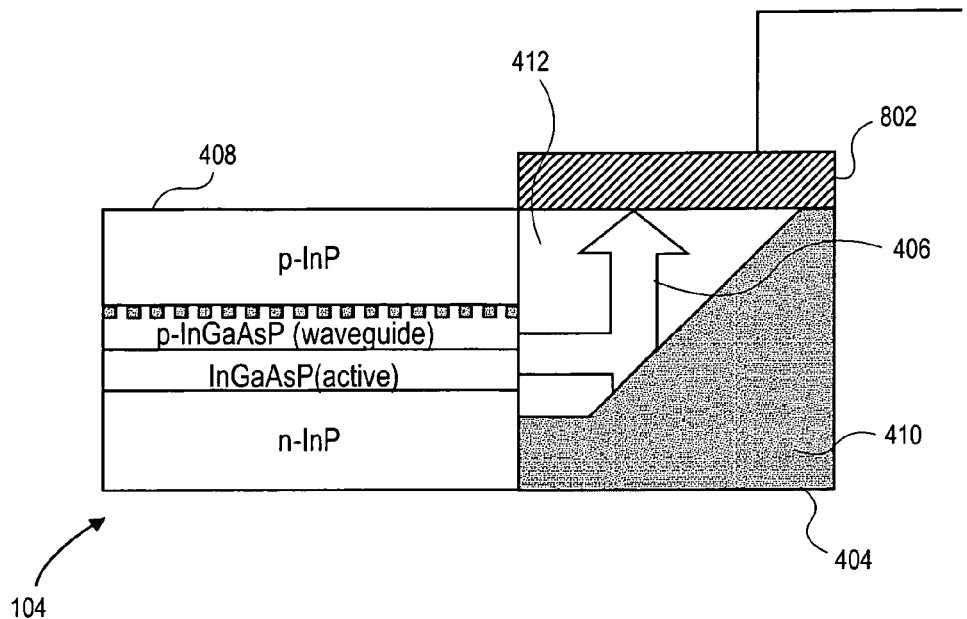
Figure 9:
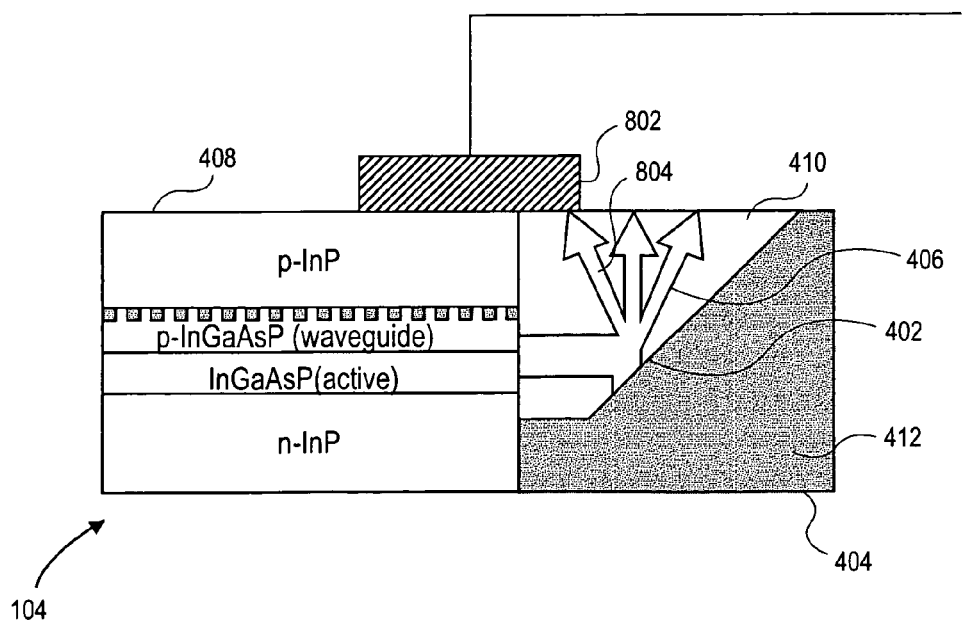

In this example, second region 412 may be comprised of a gas, such as air, in an embodiment. A light detector, such as a photodiode (as illustrated in FIGS. 7–9) may be positioned above laser 104 to receive the re-directed light beam 406. Note that test structure 404 can be used for substantially any edge-emitting laser in either a p-up or p-down configuration. Furthermore, it should be noted that in various embodiments, light beam 406 may be reflected, refracted, or diffracted from inclined interface 402 toward and through top and bottom side surface 408 and 409 of wafer 200.

In an embodiment, first region 410 may be comprised of semiconductor materal such as Indium-Phosphide material, for example. In one embodiment, a selective resist and etch process can be used to form the incline of first region 410 at an appropriate incline angle so that inclined interface 402, which may include a reflective surface, can reflect light beam 406 in a direction different from (such as orthogonal to) the light beam's original path as emitted from laser 104.

In an embodiment, the inclined interface 402 may include a layer of any suitably reflective metal deposited or disposed upon the first region 410. Examples of such metals may include Aluminum (Al), Gold (Au), and the like. Metallization processes are well known in the art of semiconductor manufacturing, and thus a suitable process to metallize second region 412 to form a reflective surface at inclined interface 402 may be utilized.

As noted previously, although test structure 404 is shown in the illustrated embodiments as optically coupled to, and receiving light from, back facet 114, test structure 404 may also be optically coupled to front facet 112. One advantage to locating test structure 404 at back facet 114, however, may be to avoid obstruction of front facet 112, since front facet 112 produces a primary light output and may need to be aligned to a collimating lens and an optical fiber. It should be noted that, in an embodiment, test structure 404 may remain optically coupled to laser 104 once laser 104 is completed. In another embodiment, test structure 404 may be removed from completed laser 104.

Figure 5:
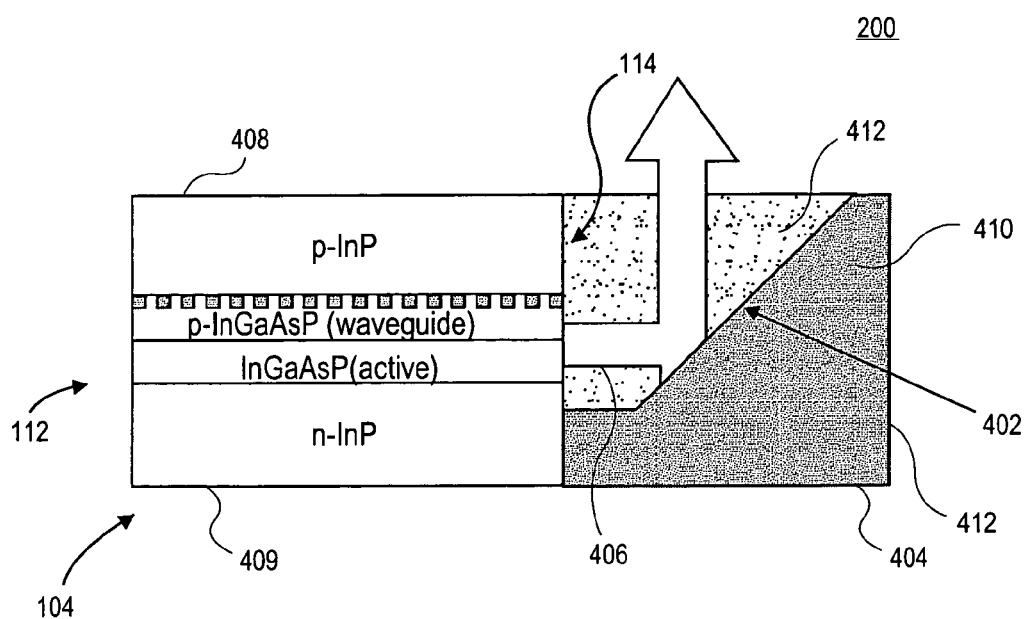

FIG. 5 illustrates an embodiment of the invention wherein first region 410 and second region 412 may both comprise substantially solid materials, each having a different index of refraction from the other. As a result of the different indexes of refraction, inclined interface 402 may comprise a reflective boundary between first region 410 and second region 412. Accordingly, inclined interface 402 may be formed at an appropriate angle so that according to well-known optical principles such as Snell's Law, light beam 406 may be reflected (or otherwise directed towards) in a direction different from (such as orthogonal to) light beam 406's original path. In an embodiment, for example, a suitable material for second region 412 may be a Silicon-Nitride material, while first region 410 may comprise an Indium-Phosphide material.

Figure 6:
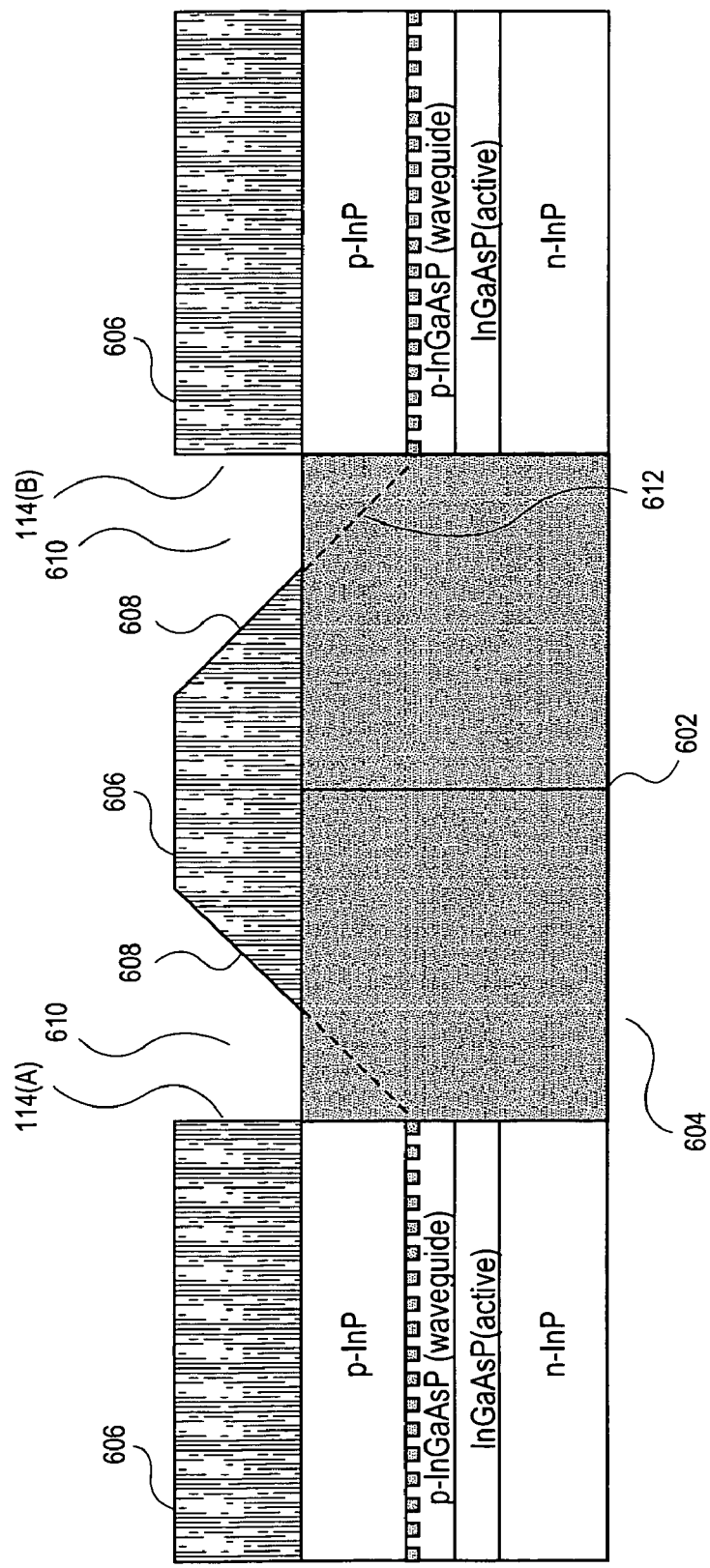
FIG. 6 is a cross-sectional view of two edge-emitting lasers coupled to a preliminary test structure during a manufacturing step according to an embodiment of the invention.

FIG. 6 illustrates a step in the manufacturing process that can form inclined interface 402 of test structure 404 in an embodiment according to the teachings of the present invention. In this example, lasers, such as laser 104, may be arranged so that a back facet 114(a) of a laser in one row opposes a back facet 114(b) of an adjacent laser located in a next row. A preliminary test structure 604 may be coupled between two back facets 114(a) and 114(b). A photoresist material 606 has been deposited or otherwise formed on the top surface of test structure 604. An etch or other process has selectively removed portions of photoresist material 606 to form inclined sections separated by openings 610 to expose portions of preliminary test structure 604. Such inclined sections have a sloped edge 608.

The sloped edge 608 can be used as a guide in selectively etching (or using another suitable chemical-mechanical process) preliminary test structure 604 through openings 610 to form an incline 612 (denoted by dotted lines) that will eventually define inclined interface 402. For example, etching acid or other etching material can be placed in trenches or openings 610 to allow selective removal of portions of preliminary test structure 604. In an embodiment, once desired incline 612 is produced, photoresist material 606 can be removed and incline 612 can be metallized. In another embodiment, second region 412 (defined by the region where preliminary test structure 604 has been removed) can be filled with a material having a different index of refraction than the material of first region 410 (e.g., preliminary test structure 604 that remains after etching).

FIG. 6 may also illustrate an arrangement of lasers on wafer 200 that can facilitate a chip-packaging process. The arrangement of lasers, as shown in FIG. 6, wherein back facet 114(a) of a laser in one row opposes back facet 114(b) of an adjacent laser located in a next row, allows scribing of test structure 604 between back facets 114(a) and 114(b). That is, once the packaging process is ready to begin, test structure 604 may be scribed down the middle (as denoted by a reference line 602), separating the lasers into individual lasers, each coupled to a separate test structure 404.

In FIG. 7, according to an embodiment of the invention, a light detector 701 may be located above test structure 404 to determine a presence and other characteristics of light beam 406 and may convert light beam 406 into an electrical current. Examples of a suitable light detector 701 may include, for instance, an avalanche photodiode, positive-intrinsic-negative (PIN) photodiode, or other photosensitive device. Light detector 701 can be used to detect a frequency, intensity, and/or other characteristics of the light beam to determine whether laser 104 is functioning according to design specifications. Detector 701 as shown is optically coupled to back facet 114, but it should be noted that light detector 701 may be optically coupled to the front facet or other location where test structure 404 is positioned as well, or where re-directed light beam 406 can be suitably detected.

FIGS. 8 and 9 illustrate other embodiments of the invention in accordance with the teachings of the present invention in which a light detector may be integrated into laser 104. FIG. 8 illustrates, for example, that a light detector 802, such as a PIN photodetector, can be grown monolithically on a top surface of test structure 404. Light detector 802 located above test structure 404 can detect re-directed light beam 406, and subsequently convert light beam 406 into an electrical current. Test structure 404, in this example, may have a first region 410 comprised of a solid material having a different index of refraction than that of the material of second region 412. Thus, in this example, light detector 802 can be grown on second region 412.

FIG. 9 illustrates that light detector 802 may be located at other suitable positions, such as partially above test structure 404 and partially above laser 104, or completely above laser 104 but adjacent to test structure 404. Such a location may be helpful, for instance, when second region 410 is comprised of a gas (e.g., air). For example, laser 104 may provide structural support for light detector 802 which partially overhangs first region 410. In an embodiment, inclined interface 402 may be suitably inclined to direct light in a manner to allow the suitably positioned light detector 802 to receive light beam 406 that may be diverging 804 from inclined interface 402. It should also be noted that other suitable detectors may also be used in other embodiments.

In conclusion, an embodiment in accordance with the teachings of the present invention can provide a test structure optically coupled to a light emitting device, such as a laser 104. The test structure includes a first region and a second region having different indexes of refraction and including an inclined interface between the two regions. When a light beam is emitted from the laser, the light beam can be received on the inclined interface and then reflected or directed toward a direction different from (such as orthogonal to) the original path of the light beam as emitted from laser 104. A presence or a non-presence of the reflected light, as well as other characteristics of the light, can be detected using a light detector. If light is detected, the light can be converted into an electrical current, and then evaluated to determine whether the laser is functioning according to design specifications. For example, characteristics of the light that may be analyzed may include frequency and intensity.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
    forming a light-emitting device on a wafer, wherein the device emits light substantially parallel to the plane of the wafer through one or both of a front facet and a back facet;
    removably optically coupling a test structure to one or both of the front facet and the back facet, the test structure formed on the wafer and comprising a first region, a second region, and an interface defined between the first and second region, the second region comprising a material different from a material of the first region, wherein the interface can direct the light beam emitted from the front facet or the back facet in a direction different from an original direction of the emitted light beam; and
    detecting the light bean directed from the interface.

2. The method of claim 1 wherein optically coupling the test structure to the one or both of the front facet and the back facet includes optically coupling the test structure to a side-emitting laser.

3. The method of claim 1 wherein directing the light beam comprises reflecting the light beam from the interface defined between the first and the second regions and wherein the first and the second regions are comprised of materials having two different refractive indexes.

4. The method of claim 1 wherein a light detector is positioned to receive the light beam directed from the interface.

5. The method of claim 1 wherein detecting the light beam includes detecting a frequency and intensity of the emitted light beam.

6. The method of claim 1 wherein the detecting the light beam includes detecting the light beam with at least one of a photodiode, avalanche photodiode, positive-intrinsic-negative (PIN) detector, and a charge coupled device.

7. The method of claim 6 wherein a light detector is integrated into the test structure.

8. A method, comprising:
    emitting a light beam from a front facet or a back facet of a device formed on a wafer, the light beam being emitted in a direction substantially parallel to the plane of the wafer;
    directing the light beam in a direction different from an original direction via use of a test structure included on the wafer and removably optically coupled to the front facet or back facet of the device;
    detecting the directed light beam; and
    evaluating the detected light beam.

9. The method of claim 8 wherein directing the light beam comprises redirecting the emitted light beam from an interface between two materials of different indexes of refraction.

10. The method of claim 8 wherein evaluating the detected light beam comprises evaluating at least one of an intensity of the detected light beam and a frequency of the detected light beam.

* * * * *